(12) United States Patent
Lin

(10) Patent No.: US 10,736,210 B2
(45) Date of Patent: Aug. 4, 2020

(54) CIRCUIT BOARD

(71) Applicant: LOTES CO., LTD, Keelung (TW)

(72) Inventor: Chin Chi Lin, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 16/564,160

(22) Filed: Sep. 9, 2019

(65) Prior Publication Data

US 2020/0084884 A1 Mar. 12, 2020

(30) Foreign Application Priority Data

Sep. 11, 2018 (CN) .......................... 2018 1 1056460

(51) Int. Cl.
*H05K 1/02* (2006.01)

(52) U.S. Cl.
CPC ........... *H05K 1/0277* (2013.01); *H05K 1/024* (2013.01); *H05K 1/0218* (2013.01); *H05K 2201/0364* (2013.01)

(58) Field of Classification Search
CPC .... H05K 1/024; H05K 1/0242; H05K 1/0213; H05K 1/0216; H05K 1/0224; H05K 1/0228
See application file for complete search history.

(56) References Cited

U.S. PATENT DOCUMENTS

| | | | | |
|---|---|---|---|---|
| 3,663,739 | A * | 5/1972 | Chevrier | H01B 7/08 174/36 |
| 6,600,395 | B1 * | 7/2003 | Handforth | H01P 3/085 174/117 AS |

FOREIGN PATENT DOCUMENTS

CN 2377700 Y 5/2000

* cited by examiner

*Primary Examiner* — Hoa C Nguyen
(74) *Attorney, Agent, or Firm* — Locke Lord LLP; Tim Tingkang Xia, Esq.

(57) ABSTRACT

A circuit board includes a plurality of insulators provided horizontally side by side and at least one first electric conductor. A first accommodating space is formed between two adjacent ones of the insulators, and each of the two adjacent ones of the insulators is provided with at least one fixing portion in the first accommodating space. The first electric conductor is accommodated in the first accommodating space, and is retained in the fixing portions of the two adjacent ones of the insulators only at two sides thereof. The first electric conductor in the circuit board is used to transmit signals and surrounded with air, and compared with the conventional circuit board in which signals are transmitted through a dielectric layer, a signal transmission effect with ultra-low signal attenuation can be achieved.

16 Claims, 7 Drawing Sheets

CIRCUIT BOARD

CROSS-REFERENCE TO RELATED PATENT APPLICATION

This non-provisional application claims priority to and the benefit of, pursuant to 35 U.S.C. § 119(a), patent application Serial No. CN201811056460.0 filed in China on Sep. 11, 2018. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to a circuit board, and in particular to a circuit board in which an electric conductor for transmitting signals is surrounded by air as a medium.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

With the development of electronic technologies, transmission attenuation of a high frequency signal is mainly affected by a medium during transmission of an electrical signal. A fundamental reason thereof is that the high frequency signal is related to a dielectric constant of the medium, and a lower dielectric constant of a medium indicates better high frequency signal transmission. For conventional media, a liquid crystal polymer (LCP), Teflon or a pure adhesive with low relative permittivity are usually used as a substrate layer to wrap a signal line.

However, a dielectric loss of the foregoing materials is still relatively large, resulting in large signal attenuation of a transmission line of a circuit board made of these materials. In addition, Teflon and the LCP are special materials with high material costs. In addition, a conventional signal conductor is provided above or below a dielectric layer, and such arrangement thickens the circuit board and makes flexibility of the circuit board decrease.

Therefore, a heretofore unaddressed need to design a novel circuit board exists in the art to address the aforementioned deficiencies and inadequacies.

SUMMARY

The present invention is directed to a circuit board with better high frequency signal transmission.

In order to achieve the foregoing objective, the present invention adopts the following technical solutions:

A circuit board includes: a plurality of insulators, provided horizontally side by side, wherein a first accommodating space is formed between a first group of two adjacent ones of the insulators, and each of the first group of two adjacent ones of the insulators is provided with at least one fixing portion in the first accommodating space; and a first electric conductor accommodated in the first accommodating space, wherein the first electric conductor is retained in the fixing portions of the first group of two adjacent ones of the insulators only at two sides thereof.

In certain embodiments, each of the at least one fixing portion is formed by protruding from a side wall of a corresponding one of the insulators, and is provided with a recessed area in a horizontal direction, and the two sides of the first electric conductor are retained in the recessed areas of the fixing portions of the first group of two adjacent ones of the insulators such that an upper surface and a lower surface of the first electric conductor are attached to the fixing portion.

In certain embodiments, the first electric conductor is flat plate shaped, and the two sides of the first electric conductor are retained in the recessed area and seamlessly fill in the recessed area.

In certain embodiments, a gap is formed between each of the two sides of the first electric conductor and the corresponding side wall.

In certain embodiments, the first electric conductor is a signal conductor.

In certain embodiments, the circuit board further includes a second electric conductor. The second electric conductor is flat plate shaped, a second accommodating space is formed between a second group of two adjacent ones of the insulators to accommodate the second electric conductor, and at least one insulator of the second group of two adjacent ones of the insulators is different from each of the insulators in the first group of two adjacent ones of the insulators.

In certain embodiments, a plastic member wraps outside the second electric conductor.

In certain embodiments, a metal shell wraps outside the plastic member.

In certain embodiments, the circuit board further includes two shielding layers and two insulating layers, wherein one of the two shielding layers is provided above the insulators, the other of the two shielding layers is provided below the insulators, one of the two insulating layers is provided above the one of the two shielding layers, and the other of the two insulating layers is provided below the other of the two shielding layers.

In certain embodiments, each of an upper surface and a lower surface of the metal shell is in contact with a corresponding one of the shielding layers.

In certain embodiments, spaces are formed between an upper surface of the first electric conductor and the one of the two shielding layers and between a lower surface of the first electric conductor and the other of the two shielding layers.

In certain embodiments, the second electric conductor is a power supply conductor.

In certain embodiments, the second electric conductor is cylindrical shaped.

In certain embodiments, the circuit board is a flexible circuit board.

Compared with the related art, the circuit board according to certain embodiments of the present invention have the following beneficial effects:

In the circuit board, the insulators are provided horizontally side by side, and a first accommodating space is formed between the two adjacent ones of the insulators. The first electric conductor is accommodated in the first accommodating space and the two sides thereof are retained in the two adjacent fixing portions, and the remaining portion of the first electric conductor is exposed in the first accommodating space and is in contact with air in the first accommodating space. Therefore, the first electric conductor is used to transmit signals and surrounded with air, and compared with the conventional circuit board in which signals are transmitted through a dielectric layer, a signal transmission effect with ultra-low signal attenuation can be achieved.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
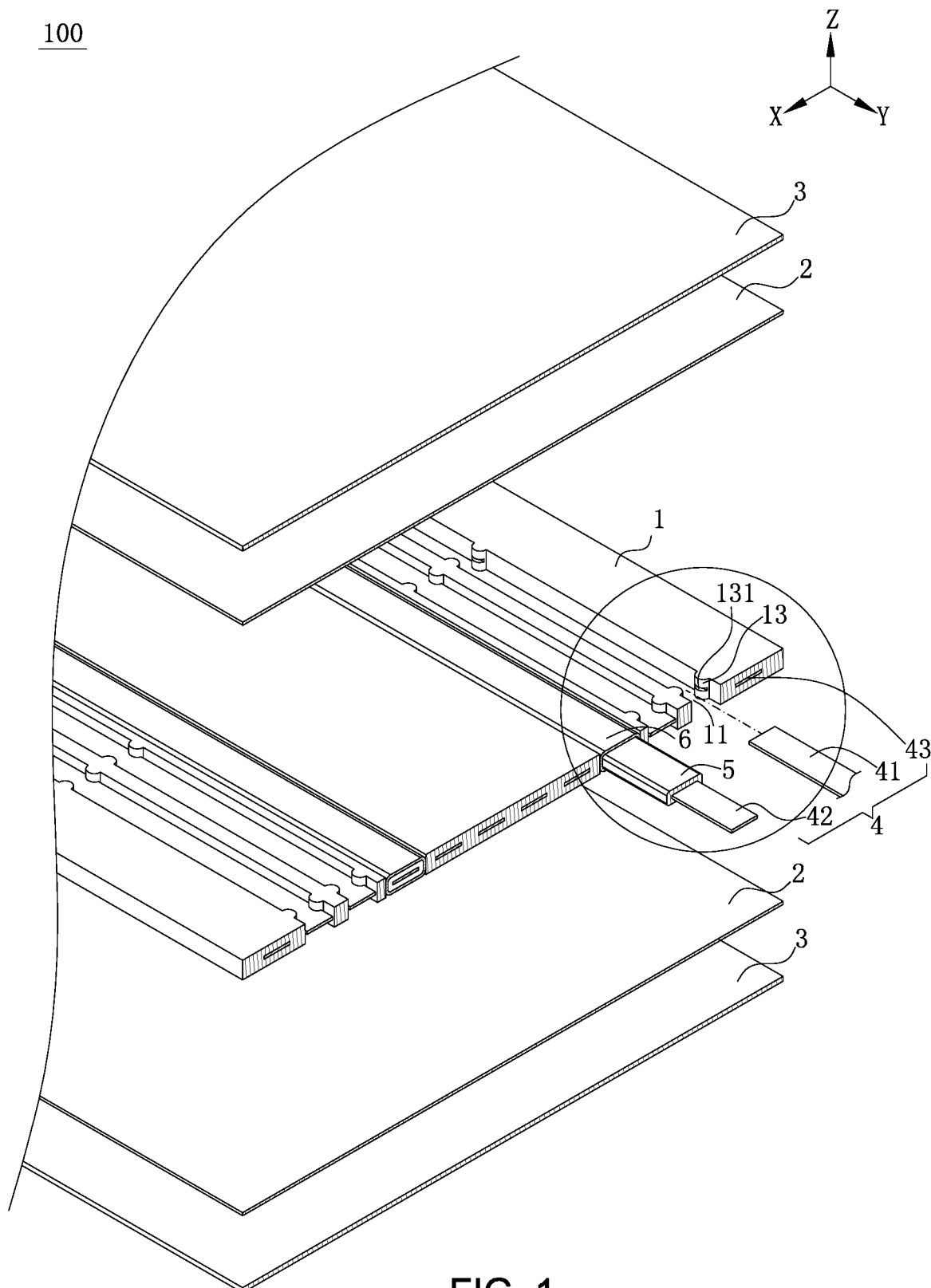
FIG. 1 is a perspective exploded view of a circuit board according to a first embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-7. In accordance with the purposes of this invention, as embodied and broadly described herein, this invention, in one aspect, relates to a circuit board.

As shown in FIG. 1 to FIG. 7, a circuit board 100 according to certain embodiments of the present invention is a flexible circuit board, and the circuit board 100 can be electrically connected to an electrical component (not shown).

FIG. 1 to FIG. 5 show a circuit board 100 according to a first embodiment of the present invention. First, an X-axis direction is defined as a left-right direction, a Y-axis direction is defined as a front-rear direction, and a Z-axis direction is defined as a vertical direction. The circuit board 100 is substantially a circuit board 100 of a five-layer structure, which includes a plurality of insulators 1. Each insulator 1 extends along the Y-axis direction to substantially form a cuboid. In other embodiments, the insulators 1 may also be in other feasible shapes, such as a cube shape. The insulators 1 are provided horizontally side by side along the X-axis direction, and a first accommodating space 11 is provided between a first group of two adjacent ones of the insulators 1 and a second accommodating space 12 is provided between a second group of two adjacent ones of the insulators 1. The circuit board 100 includes a plurality of first accommodating spaces 11 and a plurality of second accommodating spaces 12. Each first accommodating space 11 and each second accommodating space 12 are filled with air and extend along the Y-axis direction.

Figure 2:
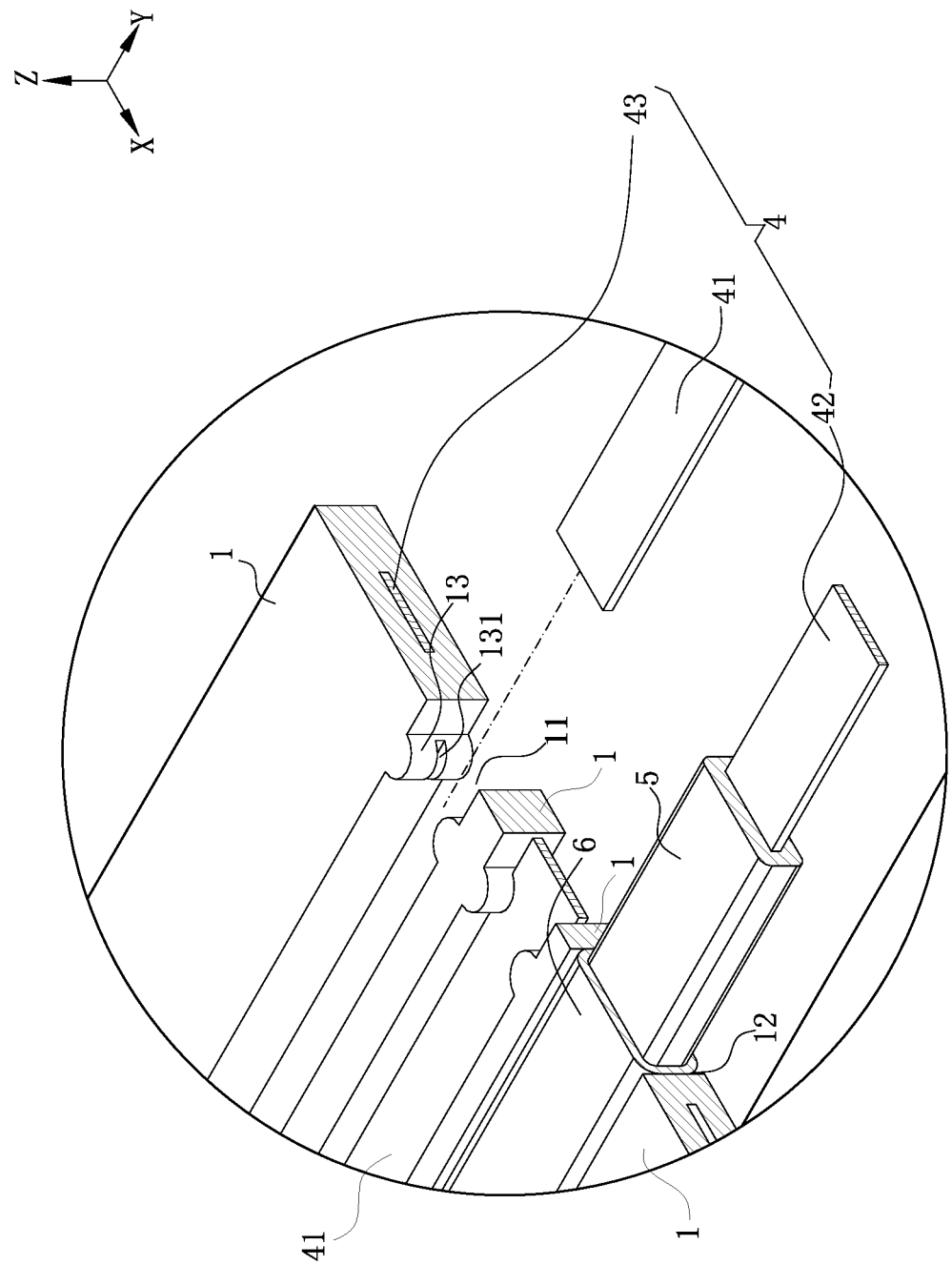
FIG. 2 is a partially enlarged schematic view in FIG. 1.
Figure 3:
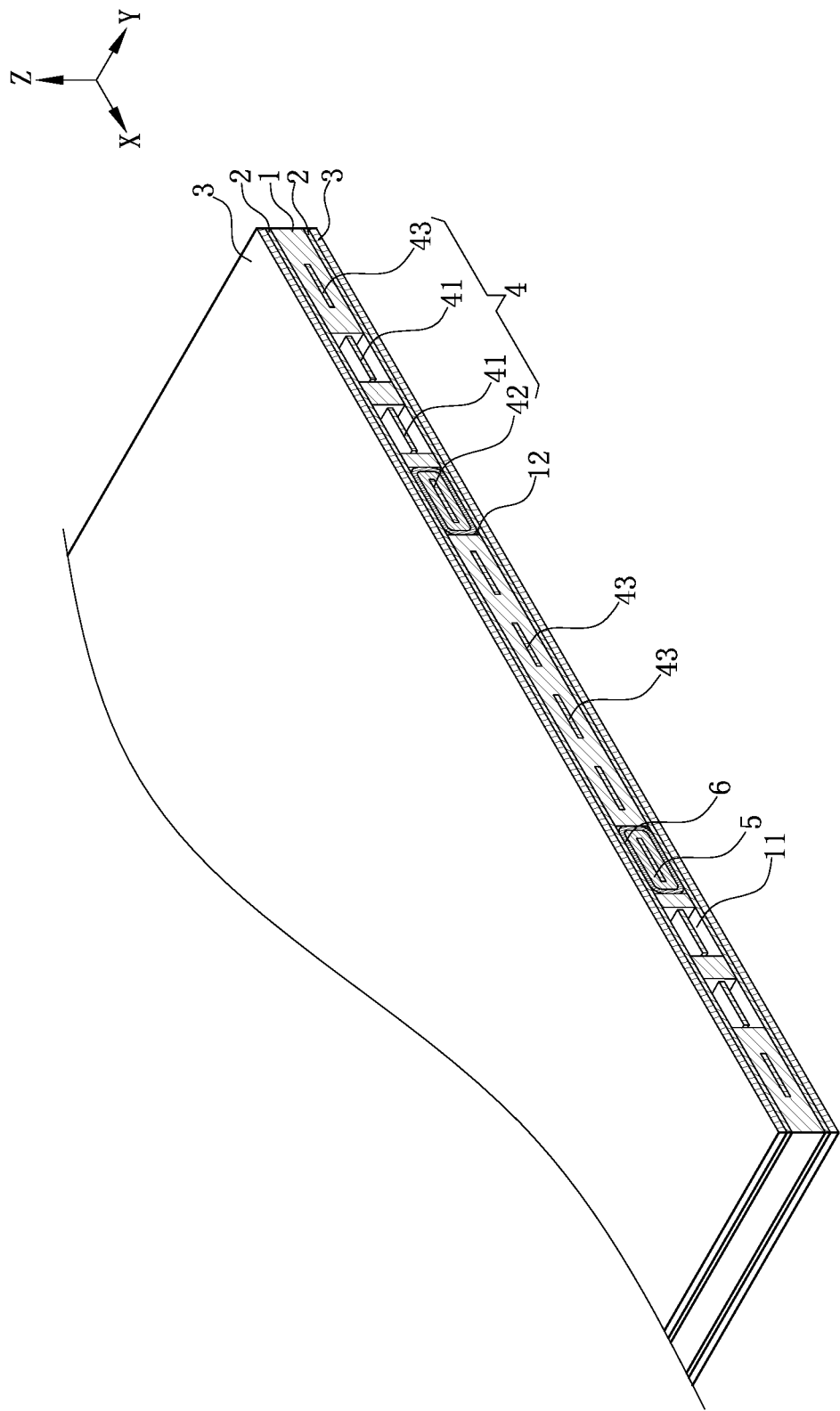
FIG. 3 is a perspective assembly view in FIG. 1.

As shown in FIG. 1 to FIG. 3, the two adjacent insulators 1 of the first group forming the first accommodating space 11 have a plurality of fixing portions 13. Each fixing portion 13 is substantially in a semi-cylindrical shape. Each fixing portion 13 is formed by protruding from a side wall of each of the two adjacent insulators 1 toward the first accommodating space 11, and the fixing portions 13 are symmetrical about a vertical plane on which a midpoint of the first accommodating space 11 lies. In other embodiments, the fixing portions 13 may further be in other feasible shapes. The fixing portions 13 may further be asymmetrically provided about the vertical plane on which the midpoint of the first accommodating space 11 lies. Each fixing portion 13 is provided with a recessed area 131 at a middle location thereof in the Z-axis direction. The recessed area 131 is horizontally provided in the X-axis direction, but is not provided to reach the side wall of the corresponding insulator 1 in the X-axis direction. In other embodiments, the recessed area 131 can further be provided to reach the side wall of the insulator 1 or even to extend into the side wall of the insulator 1. The recessed area 131 is further not limited to being provided in a horizontal direction, and can further be arranged in an inclined direction.

Figure 4:
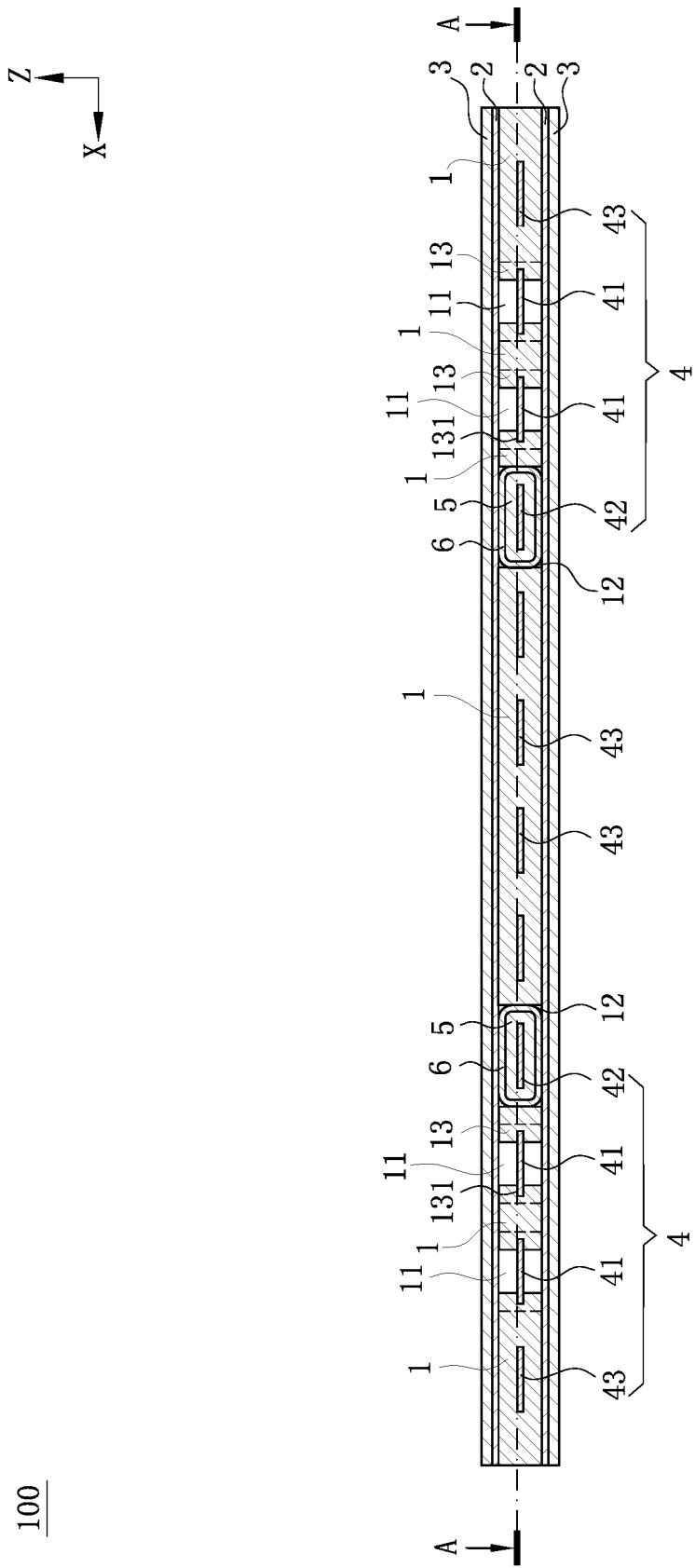
FIG. 4 is a front sectional view in FIG. 3.

As shown in FIG. 3 and FIG. 4, the second accommodating space 12 is a space between the side walls of the two adjacent insulators 1 of the second group, and each of the side walls of the two adjacent insulators 1 of the second group is a smooth plane. The circuit board 100 further includes two shielding layers 2 and two insulating layers 3. One of the two shielding layers 2 is provided above the insulators 1, and the other of the two shielding layers 2 is provided below the insulators 1. One of the two insulating layers 3 is provided above the one of the two shielding layers 2, and the other of the two insulating layers 3 is provided above the other of the two shielding layers 2. Each of shielding layers 2 is provided between the corresponding insulator 1 and a corresponding one of the insulating layers 3. In addition, the planes on which the upper surface and the lower surface of the insulator 1 lie are parallel to the X-Y plane.

As shown in FIG. 1, FIG. 2, and FIG. 4, multiple electric conductors 4 are accommodated in the first accommodating spaces 11 and the second accommodating spaces 12, and each electric conductor 4 is substantially flat plate shaped. The electric conductors 4 includes a plurality of first electric conductors 41, a plurality of second electric conductors 42, and a plurality of third electric conductors 43. Each first electric conductor 41 is a high-speed signal conductor, and two adjacent ones of the first conductors 41 form a differential pair for transmitting a differential signal. Each second electric conductor 42 is a power supply conductor 42, and each third electric conductor 43 is another functional conductor. Each of the third electric conductors 43 may be a grounding conductor, a low-speed signal conductor, a control conductor, or a preparatory conductor. The third electric conductors 43 can be adjusted and planned autonomously according to practical application conditions of the circuit board 100. The first electric conductors 41 are one-to-one accommodated in the first accommodating spaces 11, and the second electric conductors 42 are one-to-one accommodated in the second accommodating spaces 12. Two sides of each first electric conductor 41 are retained in the recessed areas 131 of the fixing portions 13, and upper surfaces and lower surfaces of the two sides of each first electric conductor 41 are seamlessly attached to upper surfaces and lower surfaces of the recessed areas 131 to form surface contacts. In addition, two ends of each first electric conductor 41, that is, plate edges of the two sides of each first electric conductor 41, are further seamlessly attached to side faces of the recessed areas 131. Finally, a state of each first electric conductor 41 located in the recessed area 131 is that the space in the recessed area 131 is fully and seamlessly filled by the first electric conductor 41.

Figure 5:
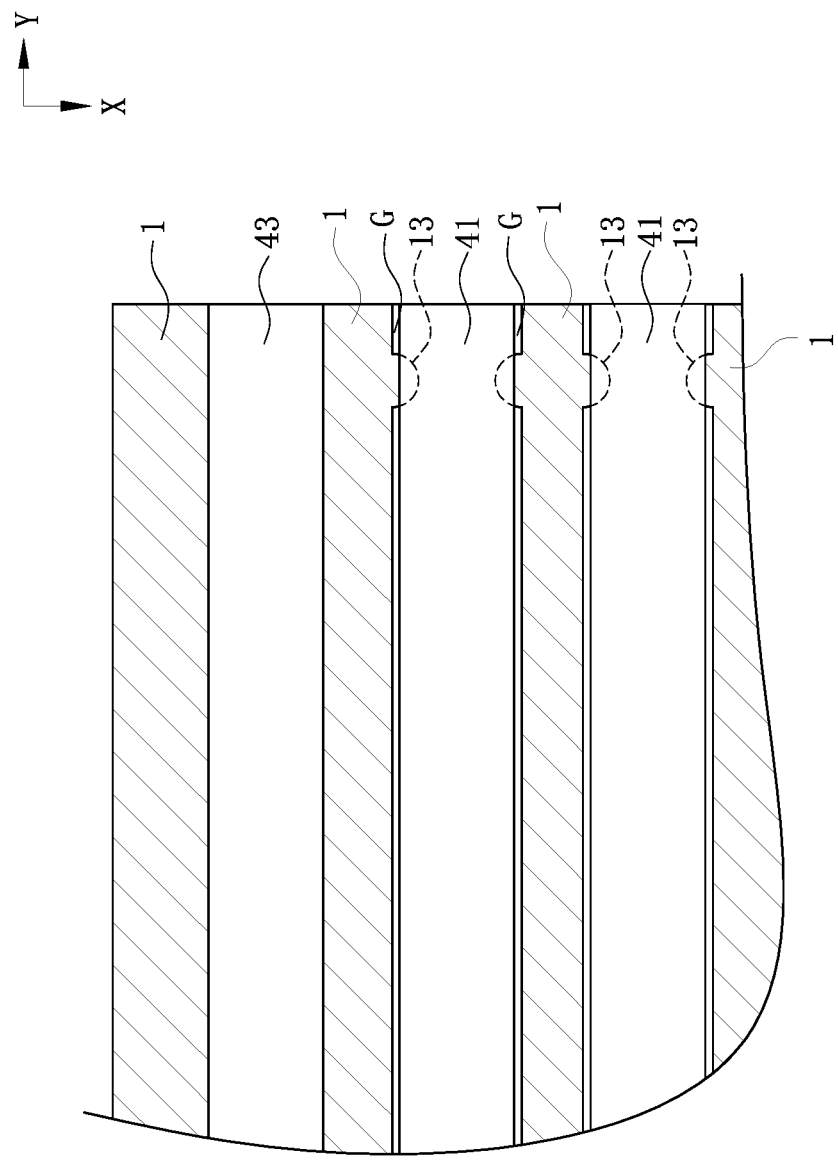
FIG. 5 is a partial sectional schematic view of FIG. 4 along the A-A direction.

As shown in FIG. 4 and FIG. 5, in this case, each recessed area 131 is horizontally provided in the X-axis direction, but is not provided to reach the side wall of the corresponding insulator 1 in the X-axis direction. Therefore, a gap G is still formed between the corresponding plate edge of the first electric conductor 41 and the side wall of the insulator 1. In addition, a space is further formed between each of the upper surface and the lower surface of the first electric conductor 41 and the corresponding shielding layer 2.

As shown in FIG. 2 and FIG. 4, a plastic member 5 wraps the second electric conductor 42. The plastic member 5 is substantially rectangular. A metal shell 6 further wraps the plastic member 5. The metal shell 6 is substantially rectangular. A left side and a right side of the metal shell 6 are respectively in contact with the side walls of the insulators 1, and an upper surface and a lower surface of the metal shell 6 are both in contact with the shielding layers 2. The remaining third electric conductor 43 is wrapped by the insulator 1.

In the flexible circuit board 100 provided in the first embodiment of the present invention, each first electric conductor 41, except for a retaining portion thereof, is exposed in the corresponding first accommodating space 11 and is in contact with air, and a dielectric constant of the air in the corresponding first accommodating space 11 is less than the dielectric constants of the Teflon, the LCP, the pure adhesive, or other conventional insulating materials. Therefore, the air replaces the Teflon, the LCP, the pure adhesive, or other conventional insulating materials to serve as a dielectric layer to wrap a signal line, such that a signal of the flexible circuit board 100 is transmitted in the air and is almost lossless, thus achieving signal transmission with ultra-low signal attenuation. In addition, the first accommodating spaces 11 and the second accommodating spaces 12 are provided between the insulators 1, and the structural strength of the layer in which the insulators 1 are located may be further reduced, such that the flexibility thereof is better than that of the insulators 1 without providing with the first accommodating space 11 and the second accommodating space 12. In addition, when the insulators 1 are made of the conventional Teflon or the LCP, manufacturing costs thereof are relatively high. When each first accommodating space 11 is provided between two adjacent insulators 1 of the first group and each second accommodating space 12 is provided between two adjacent insulators 1 of the second group, material consumption of the insulators 1 can further be reduced, thereby reducing production costs.

Figure 6:
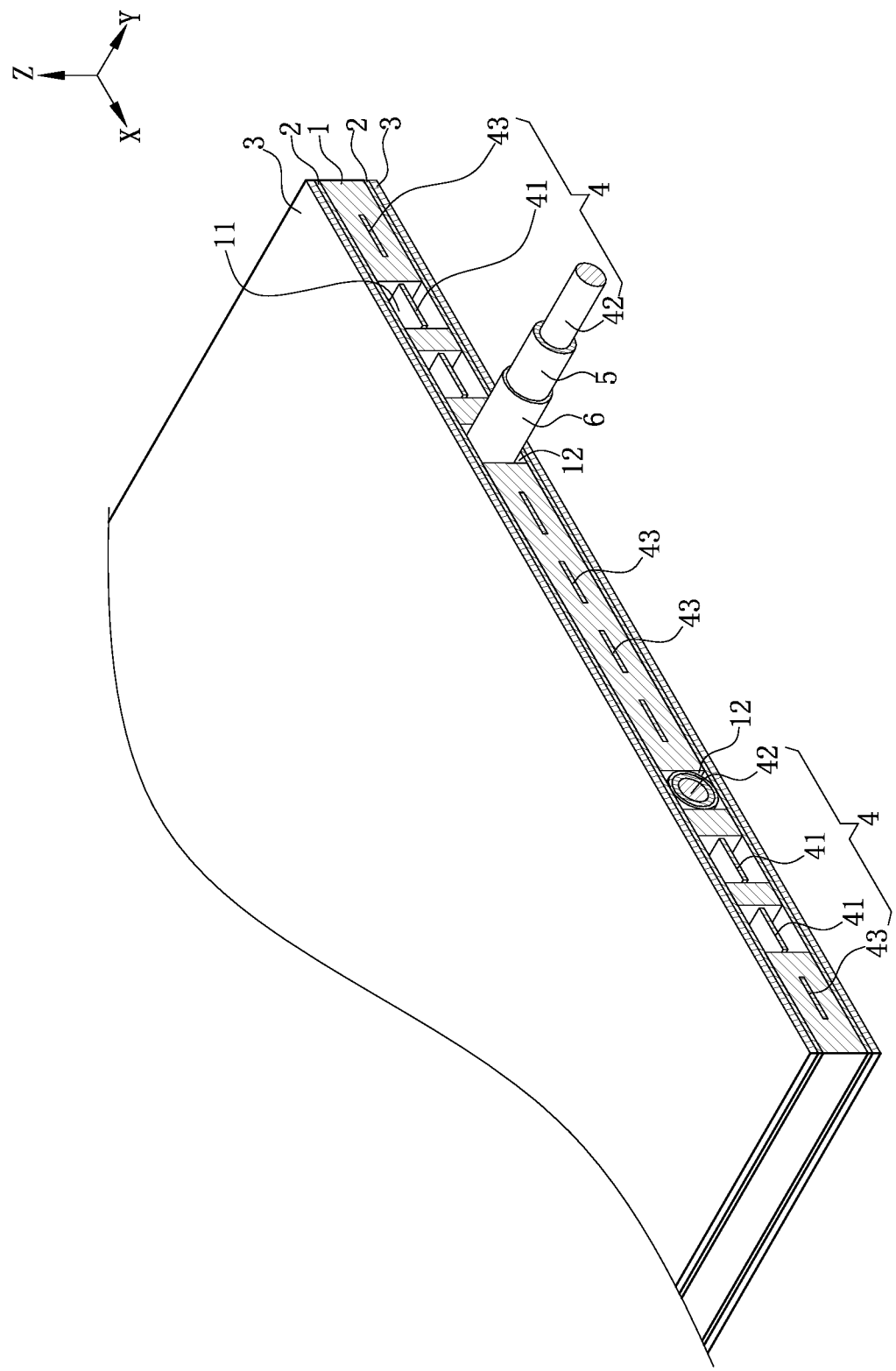
FIG. 6 is a perspective schematic view of a circuit board according to a second embodiment of the present invention.
Figure 7:
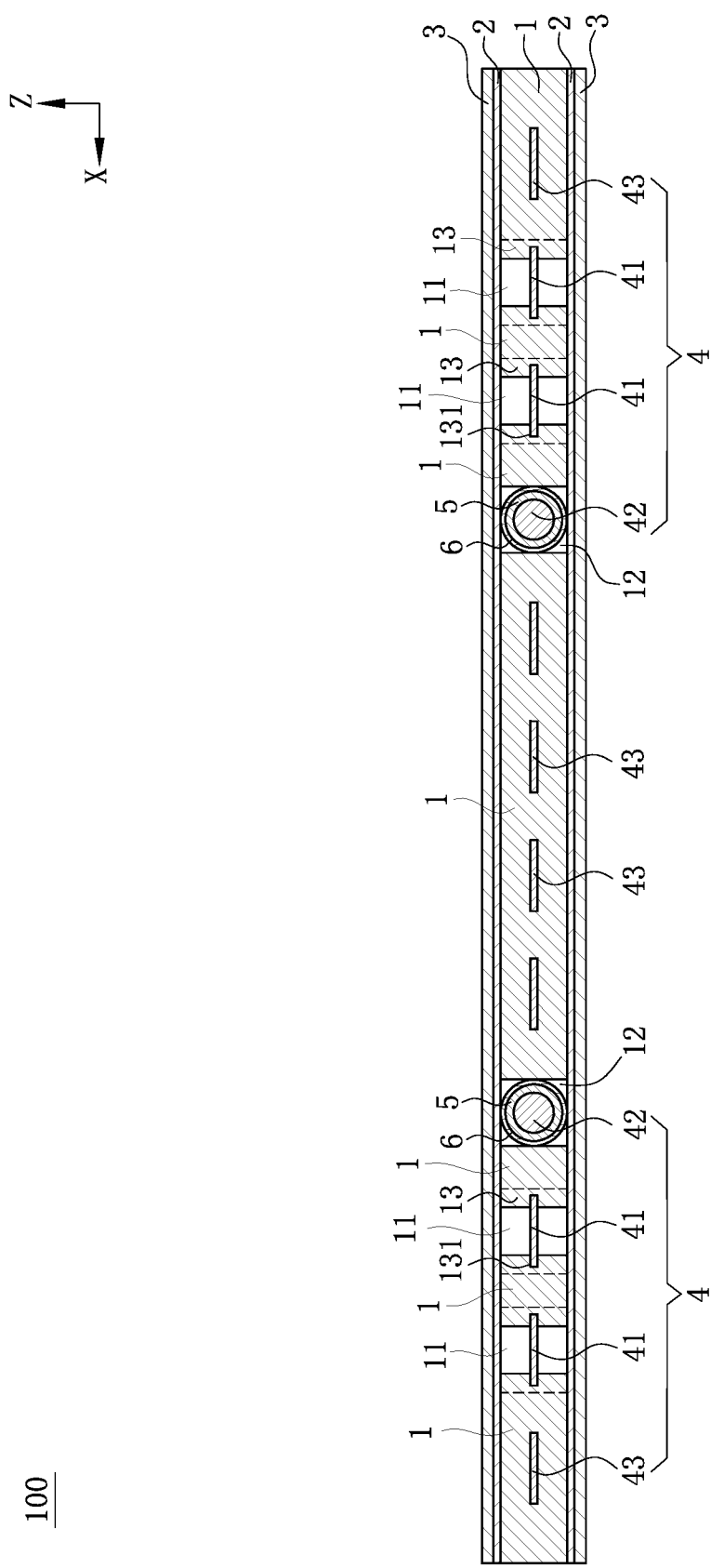
FIG. 7 is a front sectional view in FIG. 6.

FIG. 6 and FIG. 7 show a circuit board 100 according to a second embodiment of the present invention. A difference between the second embodiment and the first embodiment exists in that the second electric conductor 42 is cylindrical shaped, the plastic member 5 wrapping the second electric conductor 42 is also cylindrical shaped, and a metal housing 6 wrapping the plastic member 5 is cylindrical shaped as well. For other structures thereof, reference can be made to the corresponding structures in the first embodiment. When the second electric conductor 42 is cylindrical shaped, a diameter of the second electric conductor 42 is relatively smaller in comparison to a horizontal length thereof when the second electric conductor 42 is flat plate shaped. Therefore, a distance between the second electric conductor 42 and an adjacent electric conductor 4 becomes greater. Since the second electric conductor 42 is a power supply conductor and the power supply conductor in the circuit board 100 has a relatively large signal interference with the electric conductor 4 around the power supply conductor, the distance between the second electric conductor 42 and the adjacent electric conductor 4 can be effectively increased when the second electric conductor 42 is cylindrical shaped, thereby reducing the signal interference.

In sum, the circuit board 100 according to certain embodiments of the present invention has the following beneficial effects:

(1) A conductive layer of the conventional circuit board structure is generally provided above a dielectric layer, and another dielectric layer is provided above the conductive layer. Therefore, the signal transmission of the conductive layer is mainly affected by the dielectric layers. A lower dielectric constant of a dielectric layer indicates a better signal transmission effect. However, dielectric constants of the dielectric layers made of conventional materials are greater than the dielectric constant of air. Therefore, in certain embodiments of the present invention, the insulators 1 of the circuit board 100 are provided horizontally side by side, the first accommodating space 11 is provided between the two adjacent insulators, and the first electric conductor 41 is retained in the fixing portions 13 only on two sides thereof. Most structures of the first electric conductor 41 are in contact with air in the first accommodating space 11. Therefore, the first electric conductor 41 is used to transmit signals and surrounded by air to achieve a signal transmission effect with ultra-low signal attenuation.

(2) In the conventional circuit board, a dielectric layer can be made of the Teflon or the LCP, but the costs are high. In certain embodiments of the present invention, the insulators 1 of the circuit board 100 are provided horizontally side by side, and each first accommodating space 11 is provided between two adjacent insulators 1 of the first group and each second accommodating space 12 is provided between two adjacent insulators 1 of the second group, and at least one insulator 1 of the second group of two adjacent ones of the insulators 1 is different from each of the insulators 1 in the first group of two adjacent ones of the insulators 1, such that a material usage of the insulators 1 can be reduced, and the signal transmission can be better. Therefore, the presence of the first accommodating space 11 and the second accommodating space 12 can further reduce the production costs. In addition, the circuit board 100 is a flexible circuit board 100. Because of the presence of the first accommodating space 11 and the second accommodating space 12, a layer in which the insulator 1 lies is a non-successive layer. Therefore, a structural strength of the layer is low, thereby improving the flexibility of the circuit board 100.

(3) The conductive layer of the conventional circuit board structure is generally provided above the dielectric layer, while the electric conductors 4 of the circuit board 100 according to certain embodiments of the present invention are provided in the first accommodating spaces 11 and the second accommodating spaces 12 between the insulators 1 respectively, thereby reducing a thickness of the circuit board 100, and saving the space to enable the circuit board 100 to potentially be capable of providing more additional structures, and meanwhile improving the flexibility of the circuit board 100.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A circuit board, comprising:
a plurality of insulators, provided horizontally side by side, wherein a first accommodating space is formed between a first group of two adjacent ones of the insulators, and each of the first group of two adjacent ones of the insulators is provided with at least one fixing portion in the first accommodating space; and
a first electric conductor accommodated in the first accommodating space, wherein the first electric conductor is retained in the fixing portions of the first group of two adjacent ones of the insulators only at two sides thereof,
wherein each of the at least one fixing portion is formed by protruding from a side wall of a corresponding one of the insulators, and is provided with a recessed area in a horizontal direction, and the two sides of the first electric conductor are retained in the recessed areas of the fixing portions of the first group of two adjacent ones of the insulators such that an upper surface and a lower surface of the first electric conductor are attached to the fixing portion.

2. The circuit board according to claim 1, wherein the first electric conductor is flat plate shaped, and the two sides of the first electric conductor are retained in the recessed area and seamlessly fill in the recessed area.

3. The circuit board according to claim 1, wherein a gap is formed between each of the two sides of the first electric conductor and the corresponding side wall.

4. The circuit board according to claim 1, wherein the first electric conductor is a signal conductor.

5. The circuit board according to claim 1, further comprising a second electric conductor, wherein the second electric conductor is flat plate shaped, a second accommodating space is formed between a second group of two adjacent ones of the insulators to accommodate the second electric conductor, and at least one insulator of the second group of two adjacent ones of the insulators is different from each of the insulators in the first group of two adjacent ones of the insulators.

6. The circuit board according to claim 5, wherein a plastic member wraps outside the second electric conductor.

7. The circuit board according to claim 6, wherein a metal shell wraps outside the plastic member.

8. The circuit board according to claim 5, wherein the second electric conductor is a power supply conductor.

9. The circuit board according to claim 1, further comprising a second electric conductor, wherein the second electric conductor is cylindrical shaped, a second accommodating space is formed between a second group of two adjacent ones of the insulators to accommodate the second electric conductor, and at least one insulator of the second group of two adjacent ones of the insulators is different from each of the insulators in the first group of two adjacent ones of the insulators.

10. The circuit board according to claim 1, being is a flexible circuit board.

11. A circuit board, comprising:
a plurality of insulators, provided horizontally side by side, wherein a first accommodating space is formed between a first group of two adjacent ones of the insulators, and each of the first group of two adjacent ones of the insulators is provided with at least one fixing portion in the first accommodating space;
a first electric conductor accommodated in the first accommodating space, wherein the first electric conductor is retained in the fixing portions of the first group of two adjacent ones of the insulators only at two sides thereof;
a second electric conductor, wherein the second electric conductor is flat plate shaped, a second accommodating space is formed between a second group of two adjacent ones of the insulators to accommodate the second electric conductor, and at least one insulator of the second group of two adjacent ones of the insulators is different from each of the insulators in the first group of two adjacent ones of the insulators;

a plastic member wrapping outside the second electric conductor;

a metal shell wrapping outside the plastic member; and two shielding layers and two insulating layers, wherein one of the two shielding layers is provided above the insulators, the other of the two shielding layers is provided below the insulators, one of the two insulating layers is provided above the one of the two shielding layers, and the other of the two insulating layers is provided below the other of the two shielding layers.

12. The circuit board according to claim 11, wherein each of an upper surface and a lower surface of the metal shell is in contact with a corresponding one of the shielding layers.

13. The circuit board according to claim 11, wherein spaces are formed between an upper surface of the first electric conductor and the one of the two shielding layers and between a lower surface of the first electric conductor and the other of the two shielding layers.

14. The circuit board according to claim 11, wherein the first electric conductor is a signal conductor.

15. The circuit board according to claim 11, being is a flexible circuit board.

16. The circuit board according to claim 11, wherein the second electric conductor is a power supply conductor.

* * * * *